United States Patent
Osanai et al.

(10) Patent No.: US 9,673,807 B2
(45) Date of Patent: Jun. 6, 2017

(54) GATE VOLTAGE CONTROL APPARATUS CONFIGURED TO CONTROL A GATE VOLTAGE OF A SWITCHING DEVICE

(71) Applicant: TOYOTA JIDOSHA KABUSHIKI KAISHA, Toyota-shi, Aichi-ken (JP)

(72) Inventors: Yosuke Osanai, Toyota (JP); Asahi Ogata, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/228,496

(22) Filed: Aug. 4, 2016

(65) Prior Publication Data

US 2017/0099046 A1 Apr. 6, 2017

(30) Foreign Application Priority Data

Oct. 2, 2015 (JP) ................................ 2015-196763

(51) Int. Cl.
| | | |
|---|---|---|
| *H03K 3/00* | (2006.01) | |
| *H03K 17/16* | (2006.01) | |
| *H03K 17/567* | (2006.01) | |
| *H03K 17/687* | (2006.01) | |

(52) U.S. Cl.
CPC ......... *H03K 17/162* (2013.01); *H03K 17/168* (2013.01); *H03K 17/567* (2013.01); *H03K 17/687* (2013.01)

(58) Field of Classification Search
CPC .. H03K 17/162; H03K 17/687; H03K 17/168; H03K 17/567
See application file for complete search history.

(56) References Cited

U.S. PATENT DOCUMENTS

| | | | | |
|---|---|---|---|---|
| 7,206,179 B2 * | 4/2007 | Miyamoto | ......... | H03K 17/0828 361/118 |
| 8,203,377 B2 * | 6/2012 | Kelley | ............. | H03K 17/04123 326/21 |
| 8,508,258 B2 * | 8/2013 | Ishikawa | ............. | H01L 27/0248 327/108 |
| 8,884,660 B2 * | 11/2014 | Fukuta | ................... | H03K 17/00 327/109 |

FOREIGN PATENT DOCUMENTS

| | | |
|---|---|---|
| JP | 2014-147237 A | 8/2014 |
| JP | 2014-155359 A | 8/2014 |

* cited by examiner

*Primary Examiner* — Kenneth B Wells
(74) *Attorney, Agent, or Firm* — Oliff PLC (57) ABSTRACT

A gate voltage control apparatus is configured to perform first to third processes when turning off the gate type switching device. In the first process, the gate voltage is decreased to a value lower than a threshold value so as to increase a voltage between main terminals. In the second process, the gate voltage is controlled at a value higher than the threshold voltage after timing on which the voltage between the main terminals makes a peak value during the first process. In the third process, the gate voltage is decreased to a value equal to or lower than a threshold voltage while the voltage between the main terminals remains at a value lower than the peak value and higher than the on voltage during the second process.

4 Claims, 8 Drawing Sheets

GATE VOLTAGE CONTROL APPARATUS CONFIGURED TO CONTROL A GATE VOLTAGE OF A SWITCHING DEVICE

CROSS-REFERENCE TO RELATED APPLICATION

This application claims priority to Japanese Patent Application No. 2015-196763 filed on Oct. 2, 2015, the entire contents of which are hereby incorporated by reference into the present application.

TECHNICAL FIELD

The art disclosed herein relates to a gate voltage control apparatus for controlling a gate voltage of a gate type switching device. Notably, in the present specification, the gate type switching device means a device that switches a current between main terminals in accordance with a voltage of a gate electrode. The gate type switching device includes, for example, an FET (Field Effect Transistor), an IGBT (Insulated Gate Bipolar Transistor), and the like.

DESCRIPTION OF RELATED ART

When the gate type switching device is switched, there may be a case where a voltage or a current drastically increases and decreases repeatedly. This phenomenon is referred to as ringing. For example, Japanese Patent Application Publication No. 2014-147237 discloses an art to suppress ringing in a DC-DC converter that has two IGBTs connected in series. In this art, when the IGBT on a lower arm is turned on, the IGBT on an upper arm is temporarily turned on. It is thereby possible to suppress a ringing that occurs in the IGBT on the upper arm, when the IGBT on the lower arm is turned on.

BRIEF SUMMARY OF INVENTION

Ringing also occurs when the gate type switching device is turned off. More specifically, when the gate type switching device is turned off, a voltage between main terminals of the gate type switching device drastically increases, and additionally, a current that flows between the main terminals of the gate type switching device (i.e., a main current) drastically decreases. Consequently, electromotive force is generated by a parasitic inductor that exists in a wiring with which the gate type switching device is interposed. Due to this electromotive force, the voltage between the main terminals increases to a peak value just after turning off, and then increases and decreases repeatedly. Moreover, in conjunction with the increases and decreases in the voltage between the main terminals, the main current also increases and decreases. As such, when the gate type switching device is turned off, ringing occurs in that gate type switching device. The present specification provides an art to suppress ringing in the gate type switching device at turning off.

A gate voltage control apparatus disclosed herein controls a gate voltage of a gate type switching device. When turning off the gate type switching device, the gate voltage control apparatus performs first to third processes. In the first process, the gate voltage control apparatus decreases the gate voltage to a value equal to or lower than a threshold voltage so as to increase a voltage between main terminals of the gate type switching device from an on-voltage. In the second process, the gate voltage control apparatus controls the gate voltage at a value higher than the threshold voltage after timing on which the voltage between the main terminals makes a peak value during the first process. In the third process, the gate voltage control apparatus decreases the gate voltage to a value equal to or lower than the threshold voltage while the voltage between the main terminals remains at a value lower than the peak value and higher than the on voltage during the second process. A rate of change of the voltage between the main terminals with respect to time just after an end timing of the second process is lower than a rate of change of the voltage between the main terminals with respect to time just before a start timing of the second process.

Notably, the above-described "main terminals" mean the two terminals in which a main current flows, out of the terminals the gate type switching device has. In a MOSFET, the main terminals refer to a source and a drain. In an IGBT, the main terminals refer to an emitter and a collector. Moreover, the above-described "rate of change of the voltage between the main terminals with respect to time" means an absolute value of the rate of change with respect to time. Therefore, both of a phenomenon in which the voltage between the main terminals drastically increases and a phenomenon in which the voltage between the main terminals drastically decreases mean that the "rate of change of the voltage between the main terminals with respect to time" is high.

As mentioned above, a parasitic inductor exists in the wiring with which the gate type switching device is interposed. Moreover, a parasitic capacitance exists between the main terminals of the gate type switching device. When the gate type switching device is turned off, the voltage between the main terminals increases to the peak value due to an electromotive force from the parasitic inductor. Afterwards, the parasitic capacitance is charged with the electromotive force from the parasitic inductor. Once the parasitic capacitance is charged, the parasitic capacitance is then discharged to allow a current to flow in the parasitic inductor, and an electromotive force is generated again in the parasitic inductor. As such, just after the timing on which the voltage between the main terminals takes the peak value, generation of an electromotive force in the parasitic inductor and charging and discharging of the parasitic capacitance are repeated. In other words, just after the timing on which the voltage between the main terminals takes the peak value, ringing occurs. In contrast to this, the gate voltage control apparatus disclosed herein controls, in the second process, the gate voltage at a value higher than the threshold voltage after the timing on which the voltage between the main terminals takes the peak value. Notably, if a period of the second process were too long, the gate type switching device would be completely turned on during the second process, resulting in that the voltage between the main terminals would decrease to the on-voltage. Therefore, before the voltage between the main terminals decreases to the on-voltage during the second process, the third process (the process of decreasing the gate voltage to a value equal to or lower than the threshold voltage) is performed to end the second process. Therefore, during the second process, the voltage between the main terminals remains at a value lower than the peak value and higher than the on-voltage. When the gate voltage is controlled at a value higher than the threshold voltage in the second process, a current flows in the gate type switching device. Consequently, the parasitic capacitance is less easily charged, and ringing is easily attenuated. Moreover, energy is consumed when a current flows in the gate type switching device, which also results in that ringing is easily attenuated. Accordingly, the rate of change of the voltage between the main terminals with respect to time just after the end timing of the second process (i.e., on the start timing of the third process) is lower than the rate of change of the voltage between the main terminals with respect to time just before the start timing of the second process. In other words, ringing can be attenuated by the second process. As such, according to this gate voltage control apparatus, ringing can be suppressed.

DETAILED DESCRIPTION OF INVENTION

Embodiment 1

Figure 1:
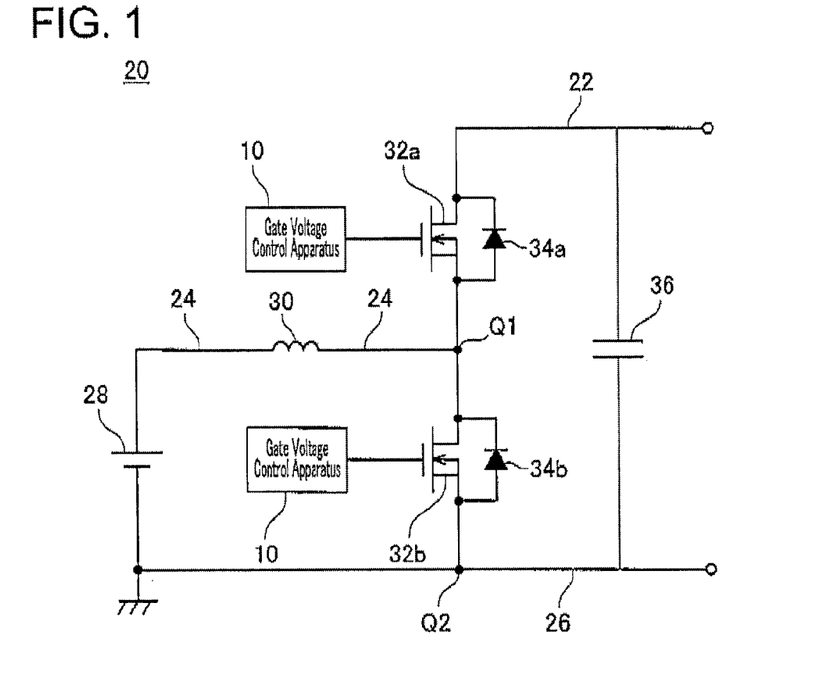
FIG. 1 is a circuit diagram of a DC-DC converter 20.

FIG. 1 shows a DC-DC converter 20 that includes a gate voltage control apparatus 10 in Embodiment 1. The DC-DC converter 20 includes a high-potential wiring 22, an intermediate wiring 24, a low-potential wiring 26, a battery 28, a reactor 30, a MOSFET 32a, a diode 34a, a MOSFET 32b, a diode 34b, and a capacitor 36. The battery 28 is connected between the intermediate wiring 24 and the low-potential wiring 26 in such an orientation as to place a positive electrode on the intermediate wiring 24 side. The reactor 30 is interposed with the intermediate wiring 24. The MOSFET 32a is connected to the intermediate wiring 24 at a position Q1 on the opposite side of the battery 28 across the reactor 30. The MOSFET 32a is connected between the intermediate wiring 24 and the high-potential wiring 22. The diode 34a is connected to the MOSFET 32a in parallel in such an orientation as to place a cathode on the high-potential wiring 22 side. The MOSFET 32b is connected to the intermediate wiring 24 at the position Q1. The MOSFET 32b is connected between the intermediate wiring 24 and the low-potential wiring 26. The diode 34b is connected to the MOSFET 32b in parallel in such an orientation as to place a cathode on the intermediate wiring 24 side. The capacitor 36 is connected between the high-potential wiring 22 and the low-potential wiring 26. The gate voltage control apparatus 10 is connected to a gate of the MOSFET 32a. Another gate voltage control apparatus 10 is connected to a gate of the MOSFET 32b.

The DC-DC converter 20 switches the MOSFETs 32a and 32b to thereby step up a voltage of the battery 28, and supply the stepped-up voltage to between the high-potential wiring 22 and the low-potential wiring 26. Moreover, the DC-DC converter 20 can also switch the MOSFETs 32a and 32b to thereby step down the high voltage supplied to between the high-potential wiring 22 and the low-potential wiring 26, and supply the stepped-down voltage to between the intermediate wiring 24 and the low-potential wiring 26.

Figure 2:
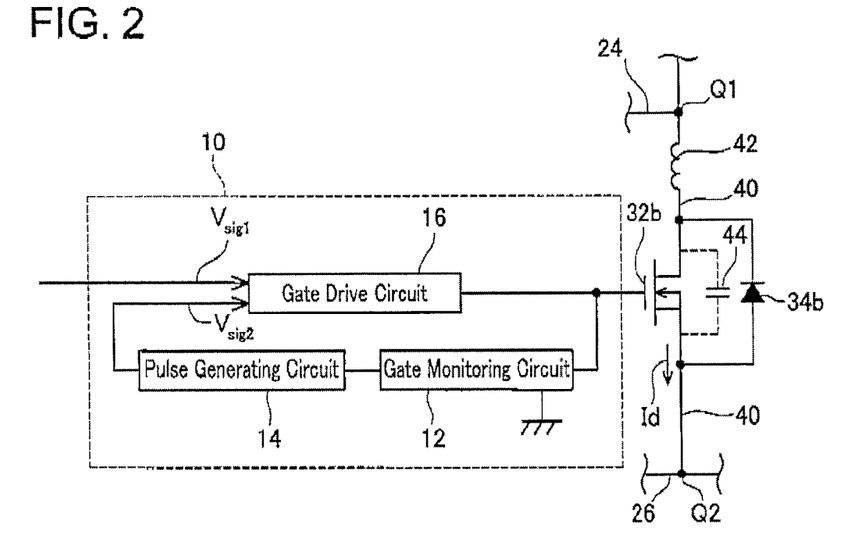
FIG. 2 is a circuit diagram of a gate voltage control apparatus 10.

Since the two gate voltage control apparatuses 10 have the same configuration, the gate voltage control apparatus 10 connected to the MOSFET 32b will hereinafter be described. As shown in FIG. 2, the gate voltage control apparatus 10 includes a gate monitoring circuit 12, a pulse generating circuit 14, and a gate drive circuit 16. The gate monitoring circuit 12 senses a gate voltage of the MOSFET 32b. The pulse generating circuit 14 generates a pulse signal $V_{sig2}$ in accordance with the gate voltage sensed by the gate monitoring circuit 12. The gate drive circuit 16 receives a control signal $V_{sig1}$ transmitted from an outside. Moreover, the gate drive circuit 16 receives the pulse signal $V_{sig2}$ transmitted from the pulse generating circuit 14. The gate drive circuit 16 controls the gate voltage of the MOSFET 32b in accordance with the control signal $V_{sig1}$ and the pulse signal $V_{sig2}$.

Moreover, an inductor 42 in FIG. 2 represents a parasitic inductor of a wiring 40 with which the MOSFET 32b is interposed. More specifically, the inductor 42 represents a parasitic inductor between the connected portion Q1 (a connected portion of the wiring 40 and the intermediate wiring 24) and a connected portion Q2 (a connected portion of the wiring 40 and the low-potential wiring 26). Moreover, a capacitor 44 in FIG. 2 represents a parasitic capacitance between a source and a drain of the MOSFET 32b.

Next, an operation of turning off the MOSFET 32b, performed by the gate voltage control apparatus 10 in Embodiment 1, will be described. Notably, an operation of turning off the MOSFET 32b, performed by a conventional gate voltage control apparatus, will also be described for comparison. Initially, with use of FIG. 3, an operation of the conventional gate voltage control apparatus will be described. The conventional gate voltage control apparatus does not have the pulse generating circuit 14. Therefore, the conventional gate voltage control apparatus controls the gate voltage based only on the control signal $V_{sig1}$.

Figure 3:
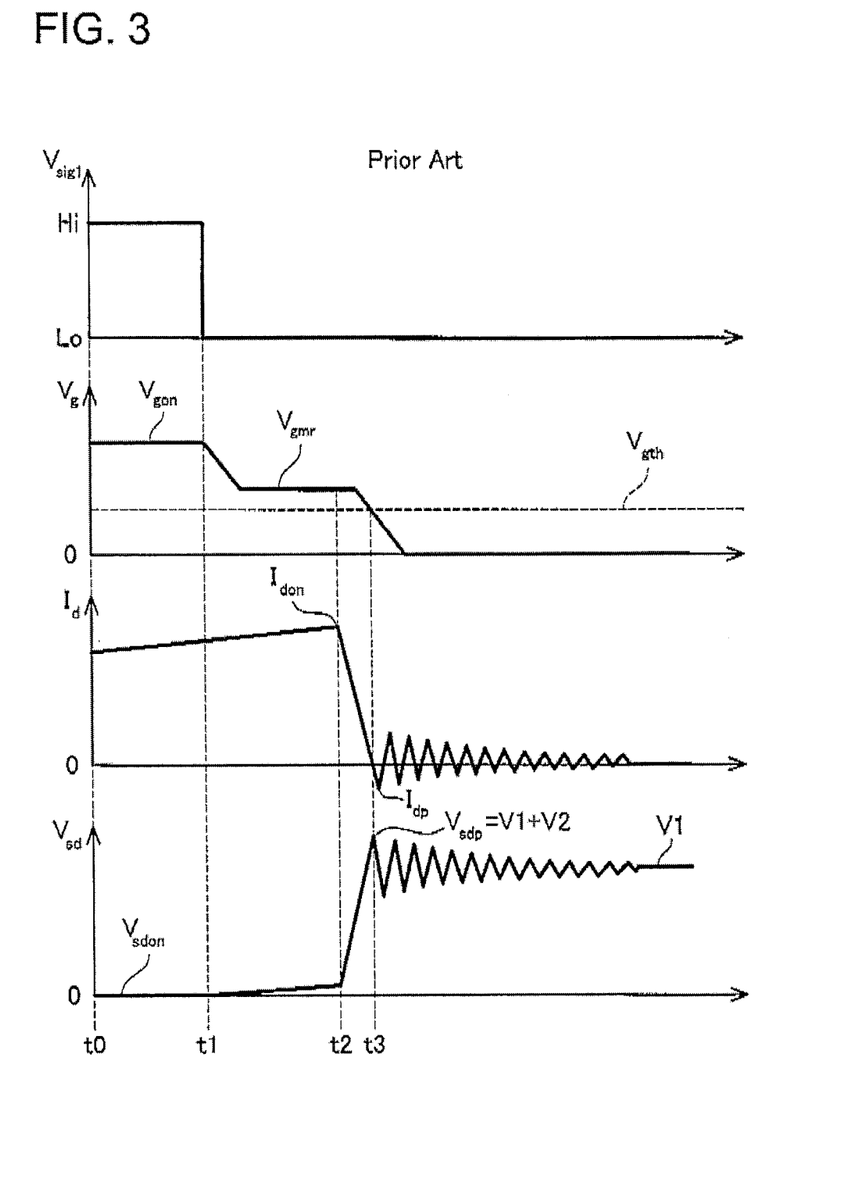
FIG. 3 is a graph that illustrates an operation of a conventional gate voltage control apparatus.

On a timing t0 in FIG. 3, the control signal $V_{sig1}$ is set at Hi. Accordingly, the gate voltage control apparatus controls the gate voltage $V_g$ at a gate on-voltage $V_{gon}$ (a voltage higher than a threshold voltage $V_{gth}$). Therefore, the MOSFET 32b is on. Accordingly, on the timing t0, a source-drain voltage $V_{sd}$ of the MOSFET 32b is at an on-voltage $V_{sdon}$ (an extremely low value), and a drain current $I_d$ of the MOSFET 32b is large. While the control signal $V_{sig1}$ is at Hi, the MOSFET 32b is maintained in an on state and the drain current $I_d$ gradually increases. While the drain current $I_d$ flows, energy is stored in the parasitic inductor 42.

When the control signal $V_{sig1}$ is switched from Hi to Lo on a timing t1, the gate control apparatus starts discharging of charges from the gate of the MOSFET 32b. Therefore, the gate voltage $V_g$ starts decreasing on the timing t1. Once the gate voltage $V_g$ decreases to a mirror voltage $V_{gmr}$, the gate voltage $V_g$ becomes approximately constant at that mirror voltage $V_{gmr}$. Even while the gate voltage $V_g$ remains at the mirror voltage $V_{gmr}$, the discharging from the gate is continued. On a timing t2 in a period when the gate voltage $V_g$ remains at the mirror voltage $V_{gmr}$, charges of the gate are decreased to a prescribed amount. Consequently, the drain current $I_d$ starts drastically decreasing, and additionally, the voltage $V_{sd}$ starts drastically increasing. In other words, on the timing t2, the MOSFET 32b starts to be turned off. Notably, in the present embodiment, the MOSFET 32b starts to be turned off before the drain current $I_d$ is saturated. After the timing t2, the gate voltage $V_g$ further decreases from the mirror voltage $V_{gmr}$, and on a timing t3, falls below the threshold voltage $V_{gth}$. Accordingly, on the timing t3, the drain current $I_d$ decreases to approximately zero.

A current $I_{don}$ in FIG. 3 is a drain current on the timing t2, i.e., a drain current just before the MOSFET 32b starts to be turned off. On the timing t2, energy E2 ($E2=0.5 \cdot L \cdot I_{don}^2$) is stored in the parasitic inductor 42. Notably, a symbol L means an inductance of the parasitic inductor 42 (i.e., a parasitic inductance). When the drain current $I_d$ drastically decreases after the timing t2, the parasitic inductor 42 causes an electromotive force in a direction along which the drain current $I_d$ flows. Accordingly, when the MOSFET 32b is turned off on the timing t3, a voltage V1 between the intermediate wiring 24 and the low-potential wiring 26, and additionally, an induction voltage V2 of the parasitic inductor 42, are applied to between the source and the drain of the MOSFET 32b. Accordingly, the voltage $V_{sd}$ takes a peak value $V_{sdp}$ (=V1+V2) on the timing t3. Moreover, on a timing somewhat later than the timing t3, the drain current $I_d$ takes a minus peak value $I_{dp}$. After the voltage $V_{sd}$ takes the peak value $V_{sdp}$, it drastically increases and decreases repeatedly, and along with the voltage $V_{sd}$, the drain current $I_d$ also drastically increases and decreases repeatedly. In other words, ringing occurs after the timing t3. Such ringing occurs by generation of an electromotive force in the parasitic inductor 42 and charging and discharging of the parasitic capacitance 44 being repeated. When a current flows due to the ringing, energy is consumed by parasitic resistance of the wiring, to thereby cause the ringing to be gradually attenuated. When the ringing is completely attenuated, the voltage $V_{sd}$ becomes stable at the voltage V1 (i.e, a value lower than the peak value $V_{sdp}$ and higher than the on-voltage $V_{sdon}$), and the drain current $I_d$ becomes stable at approximately zero.

As such, in the conventional gate voltage control apparatus, ringing continues until it is naturally attenuated. In the conventional gate voltage control apparatus, ringing cannot be suppressed. Accordingly, there occurs a problem of the MOSFET 32b being a noise source, and the like.

Next, an operation of the gate voltage control apparatus 10 in Embodiment 1 will be described. The gate voltage control apparatus 10 in Embodiment 1 includes the pulse generating circuit 14, and controls the gate voltage based on the pulse signal $V_{sig2}$ from the pulse generating circuit 14 and the control signal $V_{sig1}$.

Figure 4:
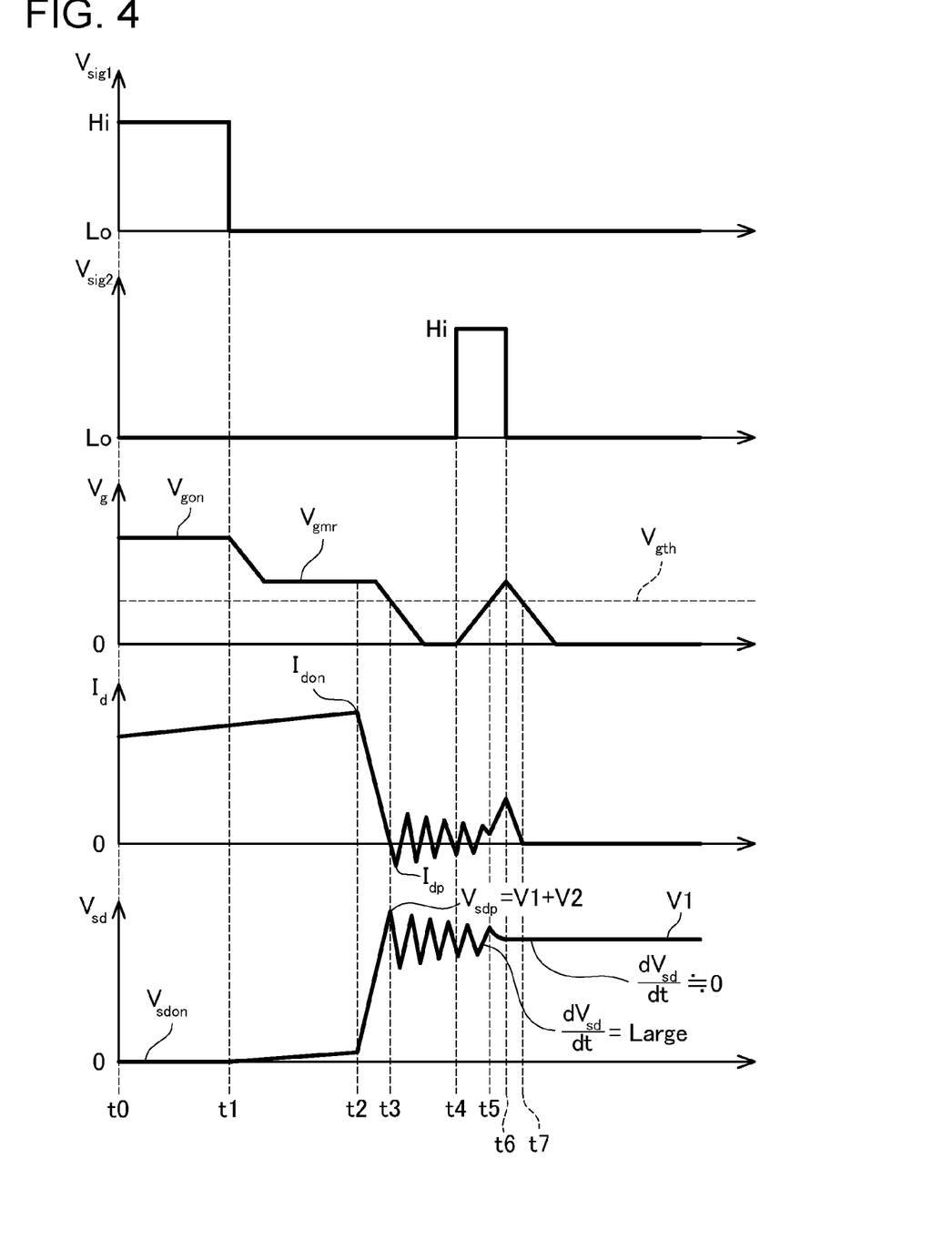
FIG. 4 is a graph that illustrates an operation of the gate voltage control apparatus 10 in Embodiment 1.

FIG. 4 shows an operation of the gate voltage control apparatus 10. An operation from the timing t0 to the timing t3 in FIG. 4 is the same as the operation from the timing t0 to the timing t3 in FIG. 3. In FIG. 4 as well, ringing occurs just after the timing t3 as in FIG. 3. In the gate voltage control apparatus 10 in Embodiment 1, the gate monitoring circuit 12 monitors the gate voltage $V_g$. The pulse generating circuit 14 generates the pulse signal $V_{sig2}$ based on the gate voltage $V_g$ sensed by the gate monitoring circuit 12. From the timing t0 to a timing t4, the pulse signal $V_{sig2}$ is maintained at Lo. When the gate voltage $V_g$ falls below the threshold voltage $V_{gth}$ on the timing t3, the pulse generating circuit 14 switches the pulse signal $V_{sig2}$ from Lo to Hi on the timing 14 after a lapse of a prescribed time from the timing t3. A time difference between the timing t3 and the timing t4 is a time difference preset in the pulse generating circuit 14. When the pulse signal $V_{sig2}$ becomes Hi on the timing t4, the gate drive circuit 16 increases the gate voltage $V_g$. The gate voltage $V_g$ exceeds the threshold voltage $V_{gth}$ on a timing t5 after a lapse of a prescribed time from the timing t4. Afterwards, the gate drive circuit 16 increases the gate voltage $V_g$ to a value approximately as high as the mirror voltage $V_{gmr}$. On a timing t6 after a lapse of a prescribed time from the timing t4, the pulse generating circuit 14 switches the pulse signal $V_{sig2}$ from Hi to Lo. A time difference between the timing t4 and the timing t6 is a time difference preset in the pulse generating circuit 14. When the pulse signal $V_{sig2}$ becomes Lo on the timing t6, the gate drive circuit 16 decreases the gate voltage $V_g$. The gate voltage $V_g$ falls below the threshold voltage $V_{gth}$ on a timing t7 after a lapse of a prescribed time from the timing t6. After the timing t7, the gate voltage $V_g$ is maintained at a value equal to or lower than the threshold voltage $V_{gth}$ (approximately 0 V). More specifically, the gate voltage $V_g$ is maintained at approximately 0 V from just after the timing t7 until a next on-timing (a timing on which the control signal $V_{sig1}$ is raised to Hi the next time).

As such, once the gate voltage $V_g$ falls below the threshold voltage $V_{gth}$ on the timing t3, the gate voltage control apparatus 10 controls the gate voltage $V_g$ at a value higher than the threshold voltage $V_{gth}$ in a period between the timing t5 and the timing t7. On the timing t7, the gate voltage control apparatus 10 then decreases the gate voltage $V_g$ to a value equal to or lower than the threshold voltage $V_{gth}$. As such, the gate voltage control apparatus 10 in Embodiment 1 performs: a process of turning off the MOSFET 32b (hereinafter referred to as a first process) between the timing t1 and the timing t3; a process of temporarily turning on the MOSFET 32b (hereinafter referred to as a second process) after the first process (i.e., in a period between the timing t5 and the timing t7); and a process of turning off the MOSFET 32b again (hereinafter referred to as a third process) after the timing t7.

As mentioned above, when the MOSFET 32b is turned off in the first process, the voltage $V_{sd}$ takes the peak value $V_{sdp}$ on the timing t3, and then ringing occurs. The second process is performed in a state where ringing occurs. When the MOSFET 32b is turned on on the timing t5 in the state where ringing occurs, a current caused by the ringing flows through the MOSFET 32b. Accordingly, the parasitic capacitance 44 is less easily charged. Furthermore, when the current flows in the MOSFET 32b, a loss is caused by the resistance of the MOSFET 32b. The energy of the ringing is thereby consumed. Accordingly, after the timing t7 on which the MOSFET 32b is turned off (i.e., an end timing of the second process, and a start timing of the third process), the ringing is eliminated. In other words, the voltage $V_{sd}$ drastically changes just before the timing t5 on which the second process starts, whereas the voltage $V_{sd}$ becomes approximately constant just after the timing t7 when the second process ends. In other words, obtained is a result that a rate of change $dV_{sd}/dt$ of the voltage $V_{sd}$ with respect to time (more specifically, an absolute value of the rate of change with respect to time) just after the timing t7 is lower than that just before the timing t5. As such, it is possible to suppress ringing by turning on the MOSFET 32b in a period between the timing t5 and the timing t7. As is clear from the comparison between FIG. 3 and FIG. 4, according to the gate voltage control apparatus 10 in Embodiment 1, ringing can be attenuated more quickly than in the conventional gate voltage control apparatus.

Moreover, it is possible to prevent a decrease in switching speed of the MOSFET 32b, by performing the second process after the timing t3 on which the voltage $V_{sd}$ takes the peak value $V_{sdp}$ as described above. To suppress ringing, it is also considered to start the second process at a stage before the timing t3 (e.g., in a period when the voltage $V_{sd}$ increases (within a period between the timing t2 and the timing t3)). However, if the second process (i.e., the process of turning on the MOSFET 32b) is performed before the timing t3, an increased rate of the voltage $V_{sd}$ and a decreased rate of the drain current $I_d$ become low, causing a decrease in switching speed. Therefore, by performing the second process after the timing t3 as in Embodiment 1, it is possible to suppress ringing without decreasing the switching speed.

Notably, even if the MOSFET 32*b* is turned on in a period between the timing t5 and the timing t7 (hereinafter referred to as a period of the second process), the voltage $V_{sd}$ remains at a value close to the voltage V1, without excessively decreasing. This is because the period of the second process is short, and hence the gate voltage $V_g$ is not increased to reach the gate on-voltage $V_{gon}$. The voltage $V_{sd}$ during the period of the second process is high, and hence when a current flows in the MOSFET 32*b* during the period of the second process, a loss easily occurs. Accordingly, ringing can more effectively be attenuated. During the period of the second process, the voltage $V_{sd}$ remains at a value between the peak value $V_{sdp}$ and the on-voltage $V_{sdon}$, and closer to the peak value $V_{sdp}$ than to the on-voltage $V_{sdon}$. More specifically, during the period of the second process, the voltage $V_{sd}$ remains at a value within a maximum amplitude $\Delta V$ of the ringing with respect to the voltage V1 (i.e., a value V1±$\Delta V$). Notably, the maximum amplitude $\Delta V$ of the ringing has a relation of $\Delta V=V2=V_{sdp}-V1$.

Notably, during the period of the second process, a current based on the voltage V1 between the intermediate wiring 24 and the low-potential wiring 26 also flows, in addition to the current due to the ringing. If the period of the second process is too long, a loss caused by the current based on the voltage V1 becomes large, and a turn-off loss of the MOSFET 32*b* becomes large. Accordingly, the length of the period of the second process is preferably set such that a loss E1 caused in the MOSFET 32*h* during the period of the second process is equal to or less than twofold of energy E2 stored in the parasitic inductor 42 before turning off. Notably, the loss E1 can be expressed by $$E1=\int_{t5}^{t7}I_d V_{sd} dt$$

Moreover, the energy E2 is expressed by $E2=0.5 \cdot L \cdot I_{don}^2$ as described above. If a relation of $E1 \leq 2 \cdot E2$ (i.e., $E1 \leq L \cdot I_{don}^2$) is satisfied, the loss E1 does not become excessively large. Moreover, if the loss E1 is too small relative to the energy E2, ringing cannot sufficiently be attenuated during the period of the second process, and ringing remains after the period of the second process. Therefore, the length of the period of the second process is preferably set such that the relation of $E1 \geq 0.5 \cdot E2$ is satisfied. It is more preferable to satisfy the relation of E1=E2.

Embodiment 2

Figure 5:
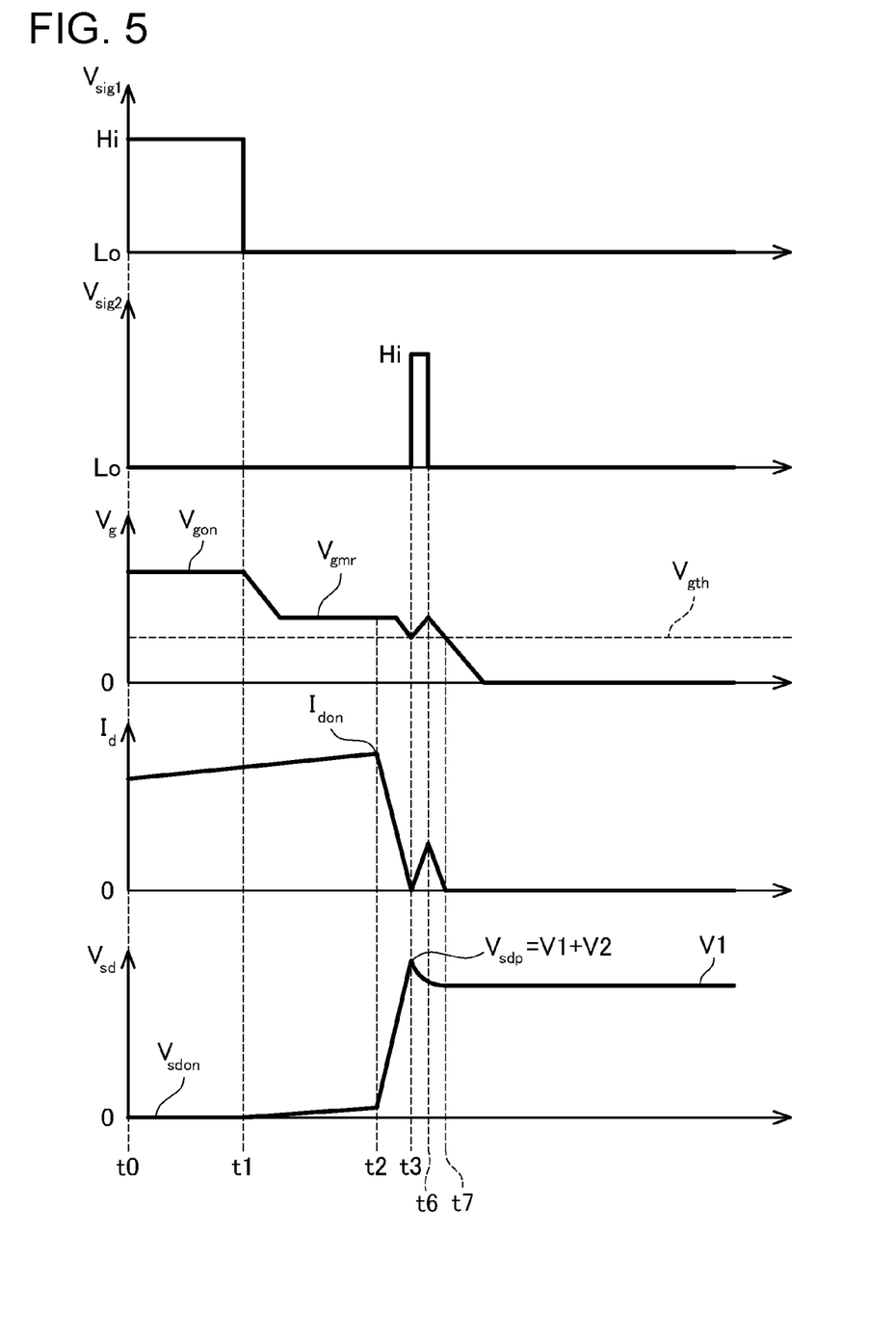
FIG. 5 is a graph that illustrates an operation of the gate voltage control apparatus 10 in Embodiment 2.

As shown in FIG. 4, the gate voltage control apparatus 10 in Embodiment 1 mentioned above turns on the MOSFET 32*b* on the timing t5 after a lapse of a prescribed time from the timing t3. However, if the MOSFET 32*b* is turned on on a timing closer to the timing t3, ringing can be attenuated more quickly. As shown in FIG. 5, the gate voltage control apparatus in Embodiment 2 turns on the MOSFET 32*b* on a timing approximately the same as the timing t3. In other words, the MOSFET 32*b* is turned on just after the timing t3 on which the peak value $V_{sdp}$ of the voltage $V_{sd}$ is observed. According to the configuration in FIG. 5, the second process is performed approximately simultaneously with the occurrence of the ringing, and hence the ringing can be attenuated more quickly. Notably, if the second process is started before the timing t3, the switching speed of the MOSFET 32*b* is decreased, as mentioned above, and hence it is necessary to perform the second process after the timing t3, so as not to decrease the switching speed.

Embodiment 3

Figure 6:
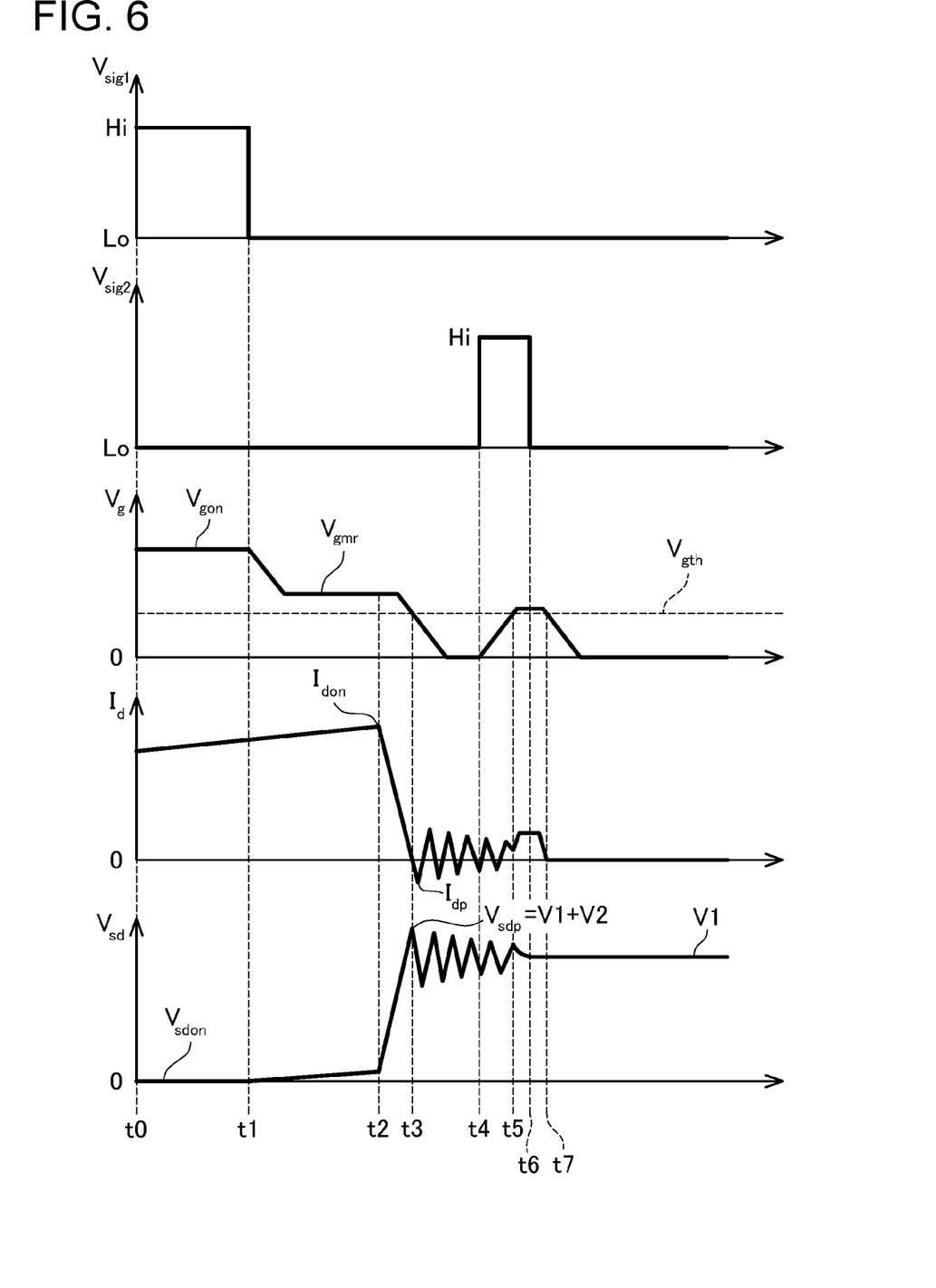
FIG. 6 is a graph that illustrates an operation of the gate voltage control apparatus 10 in Embodiment 3.

As shown in FIG. 4, in Embodiment 1 mentioned above, the gate voltage $V_g$ is increased to the mirror voltage $V_{gmr}$ during the period of the second process. However, if the gate voltage $V_g$ is increased to the mirror voltage $V_{gmr}$, there may be a case where the excessively high drain current $I_d$ may flow during the period of the second process. In contrast to this, as shown in FIG. 6, the gate voltage control apparatus in Embodiment 3 controls the gate voltage $V_g$ during the period of the second process, at a voltage lower than the mirror voltage $V_{gmr}$. By limiting the gate voltage $V_g$ to lower than the mirror voltage $V_{gmr}$ as such, it is possible to control the drain current $I_d$ during the period of the second process. Therefore, a phenomenon in which the excessively high drain current $I_d$ flows during the period of the second process to thereby cause an excessively large loss can be suppressed. In other words, according to the configuration in Embodiment 3, a loss during the period of the second process can easily be controlled.

Embodiment 4

Figure 7:
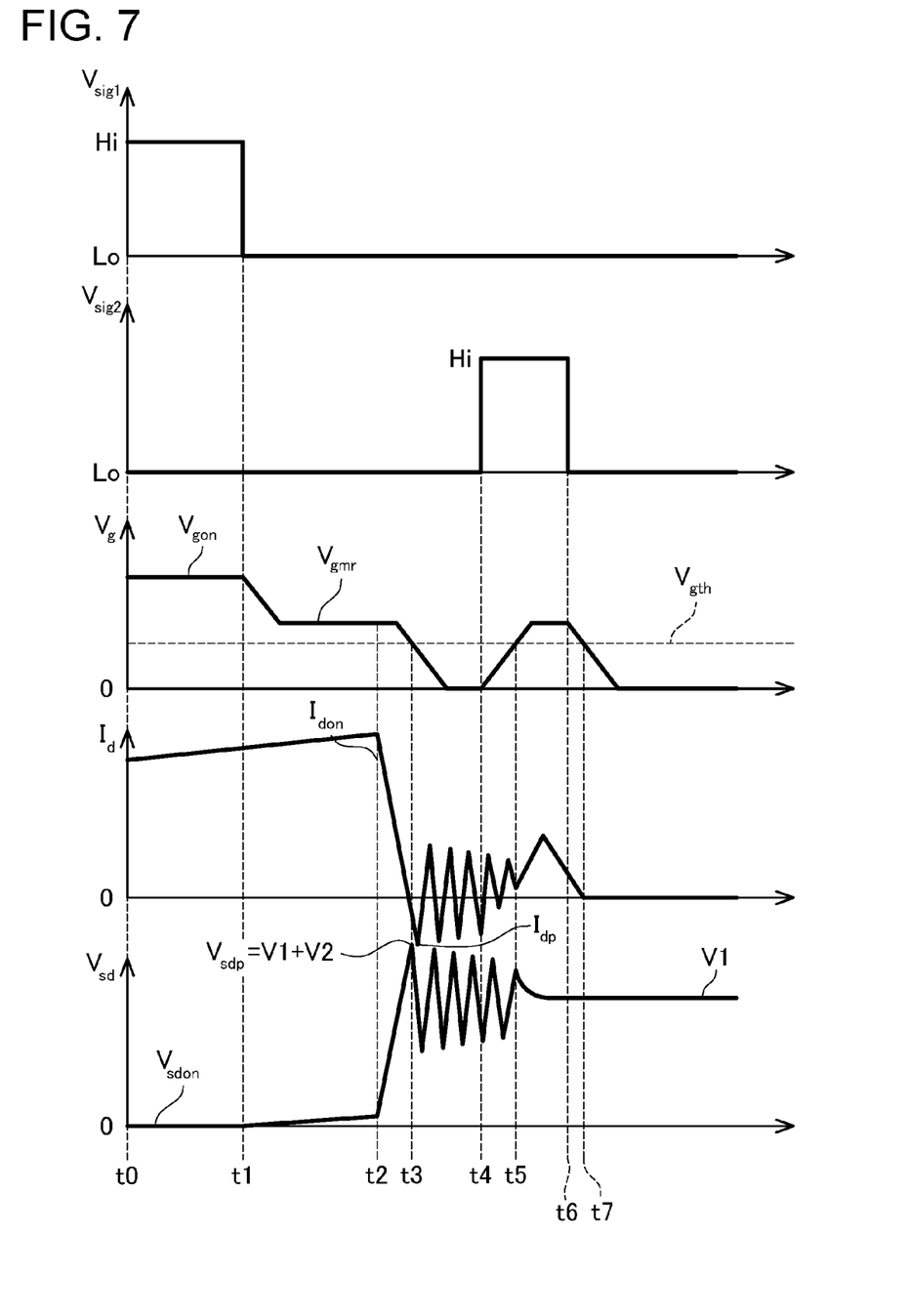
FIG. 7 is a graph that illustrates an operation of the gate voltage control apparatus 10 in Embodiment 4.

In Embodiment 1 mentioned above, the length of the period of the second process is fixed. However, as mentioned above, the loss E1 caused during the period of the second process is preferably made equal to the energy E2 stored in the parasitic inductor 42 before turning off ($=0.5 \cdot L \cdot I_{don}^2$). Therefore, an appropriate length of the period of the second process changes depending on the drain current $I_{don}$ before turning off. The gate voltage control apparatus in Embodiment 4 changes the length of the period of the second process in accordance with the current $I_{don}$. In other words, the gate voltage control apparatus in Embodiment 4 has a function of monitoring the drain current $I_d$. If the drain current $I_{don}$ before turning off is small, the control as in FIG. 4 is performed. If the drain current $I_{don}$ before turning off is large, an amplitude of the ringing becomes large, and hence the period of the second process is made longer as shown in FIG. 7. According to the configuration in Embodiment 4, it is possible to reduce the loss E1 caused during the period of the second process, while setting the length of the period of the second process to a length necessary for attenuation of the ringing.

Figure 8:
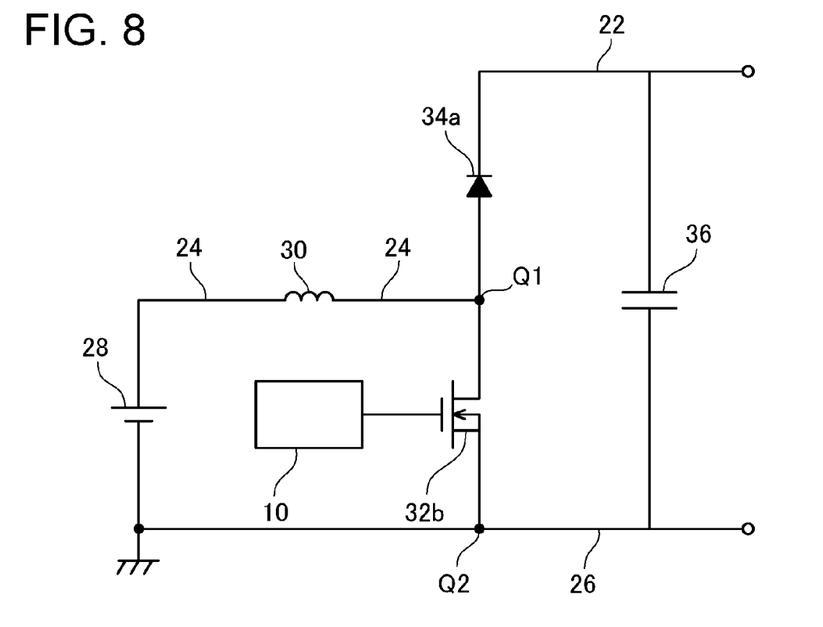
FIG. 8 is a circuit diagram of a step-up converter.
Figure 9:
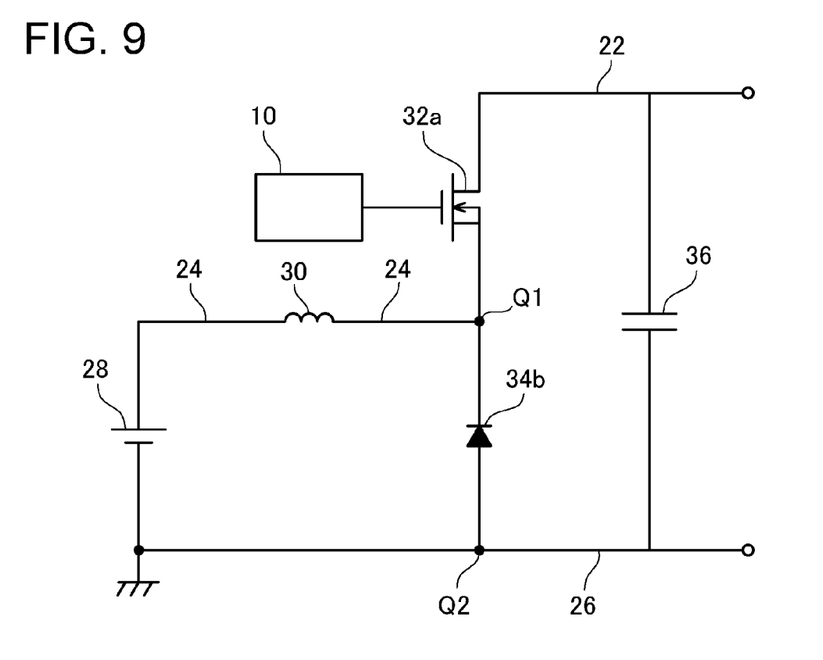
FIG. 9 is a circuit diagram of a step-down converter.
Figure 10:
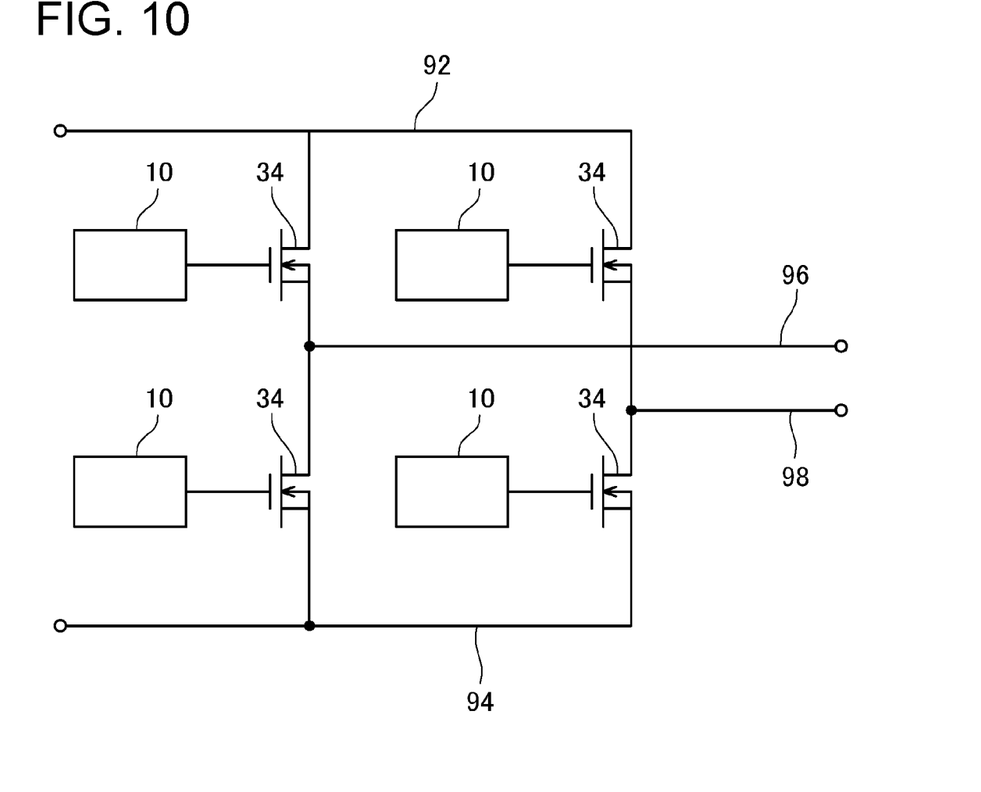
FIG. 10 is a circuit diagram of an inverter.

Notably, in Embodiment 1 mentioned above, there has been described an example in which the gate voltage control apparatus 10 is applied to the DC-DC converter 20 that has a step-up function and a step-down function. However, as in FIG. 8, the gate voltage control apparatus 10 in the embodiment may be applied to a converter exclusively intended for stepping-up. Moreover, as in FIG. 9, the gate voltage control apparatus 10 in the embodiment may be applied to a converter exclusively intended for stepping-down. Moreover, as shown in FIG. 10, the gate voltage control apparatus 10 in the embodiment may be used for controlling a gate type switching device in an inverter circuit. The inverter circuit in FIG. 10 includes a high-potential wiring 92, a low-potential wiring 94, output wirings 96 and 98, and four MOSFETs 34. The MOSFETs 34 are connected between the high-potential wiring 92 and the output wiring 96, between the output wiring 96 and the low-potential wiring 94, between the high-potential wiring 92 and the output wiring 98, and between the output wiring 98 and the low-potential wiring 94, respectively. The inverter circuit allows the four MOSFETs 34 to be switched, to thereby convert a direct-current voltage applied to between the high-potential wiring 92 and the low-potential wiring 94 into an alternating-current voltage, and supply the alternating-current voltage to between the output wirings 96 and 98. The gate voltage control apparatus 10 allows each of the MOSFETs 34 to be switched.

Moreover, in Embodiment 1 mentioned above, the gate voltage control apparatus 10 senses the gate voltage $V_g$, and starts the second process after the timing t3 on which the gate voltage $V_g$ falls below the threshold voltage $V_{gth}$. However, the gate voltage control apparatus 10 may sense the drain current $I_d$, and start the second process after the drain current $I_d$ makes the minus peak value $I_{dp}$. Moreover, the gate voltage control apparatus 10 may sense the voltage $V_{sd}$, and start the second process after the voltage $V_{sd}$ makes the peak value $V_{sdp}$. Moreover, instead of monitoring a voltage or a current, the gate voltage control apparatus 10 may be allowed to store a value of time (a fixed value), and start the second process when the time thus stored elapses from the timing t1.

Moreover, in the embodiments mentioned above, a MOSFET is used as the gate type switching device. However, other gate type switching devices such as an IGBT and the like may be used.

Suitable configurations in the embodiments described above will hereinafter be enumerated. Notably, each of the configurations enumerated below has utility independently.

In a constitution disclosed herein as an example, a relation of $E1 \leq L \cdot I^2$ is satisfied. Notably, the symbol L means a parasitic inductance of wiring with which the gate type switching device is interposed. The symbol I means a current flowing through the gate type switching device before turning off. The symbol E1 means a loss caused in the gate type switching device during the second process.

The energy E2 stored in the parasitic inductance before turning off of the gate type switching device is in the relation of $E2=0.5 \cdot L \cdot I^2$. If the energy consumed in the gate type switching device during the second process (i.e, the loss E1) is equal to E2, it is possible to suppress ringing almost without increasing the turn-off loss. If the loss E1 during the second process is too large relative to the energy E2, the turn-off loss becomes large. Although it is difficult to correctly control the loss E1 during the second process, if the relation of $E1 \leq L \cdot I^2$ (i.e., $E1 \leq 2 \cdot E2$) is satisfied, it is possible to suppress ringing without increasing the turn-off loss so much.

In a constitution disclosed herein as an example, a gate voltage control apparatus may be configured to control the gate voltage at a value lower than a mirror voltage of the gate type switching device during the second process. Notably, when charging the gate of the gate type switching device, there may be a period (called a mirror period) in which the gate voltage is maintained at a nearly constant value. The mirror voltage means the value of the gate voltage during the mirror period.

If a large current flows in the gate type switching device during the second process, the loss caused in the gate type switching device becomes large. By controlling the gate voltage at a value lower than the mirror voltage as described above, it is possible to prevent a large current from flowing in the gate type switching device during the second process. It is thereby possible to prevent the loss caused in the gate type switching device during the second process from being excessively large.

In a constitution disclosed herein as an example, a gate voltage control apparatus may be configured to make a period of the second process longer as a current flowing in the gate type switching device before turning off is larger.

As a larger current flows in the gate type switching device before turning off, larger energy is stored in the parasitic inductor, and ringing that has a large amplitude more easily occurs. To sufficiently suppress such ringing, the period of the second process needs to be made longer. On the other hand, if the period of the second process is too long, the loss caused in the gate type switching device becomes large. Therefore, by adjusting the length of the period of the second process in accordance with the magnitude of the current that flows in the gate type switching device before turning off, it is possible to appropriately suppress the ringing, and suppress the loss as well.

In a constitution disclosed herein as an example, the gate voltage control apparatus may be configured to sense the gate voltage and start the second process after a timing on which the gate voltage falls below the threshold voltage during the first process.

The timing on which the gate voltage falls below the threshold voltage approximately coincides with the timing on which the voltage between the main terminals makes the peak value. Therefore, the second process can be started based on the gate voltage. Moreover, according to this configuration, the gate voltage can be controlled based on the gate voltage, and hence the second process can be performed with a simple circuit configuration.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

The invention claimed is:

1. A gate voltage control apparatus configured to control a gate voltage of a switching device,
   wherein, when turning off the switching device, the gate voltage control apparatus performs:
   a first process of decreasing the gate voltage to a value equal to or lower than a threshold voltage so as to increase a voltage between main terminals of the switching device from an on-voltage;
   a second process of controlling the gate voltage to become a value higher than the threshold voltage after the time at which the voltage between the main terminals becomes a peak value during the first process; and
   a third process of decreasing the gate voltage to a value equal to or lower than the threshold voltage while the voltage between the main terminals remains at a value lower than the peak value and higher than the on-voltage during the second process, and
   wherein
   a rate of change of the voltage between the main terminals with respect to time just after the end of the second process is lower than a rate of change of the voltage between the main terminals with respect to a time just before the start of the second process.

2. The gate voltage control apparatus of claim 1, wherein the gate voltage control apparatus is further configured to control the gate voltage to become a value lower than a mirror voltage of the switching device during the second process.

3. The gate voltage control apparatus of claim 1, wherein the gate voltage control apparatus is further configured to increase a period of the second process as a current flowing in the switching device before turning off increases.

4. The gate voltage control apparatus of claim 1, wherein the gate voltage control apparatus is further configured to sense the gate voltage and start the second process after a time at which the gate voltage falls below the threshold voltage during the first process.

* * * * *